(12) United States Patent
Hatakeyama

(10) Patent No.: US 7,749,839 B2
(45) Date of Patent: Jul. 6, 2010

(54) SEMICONDUCTOR DEVICE INCLUDING A FLOATING GATE ELECTRODE HAVING STACKED STRUCTURE

(75) Inventor: Kazuo Hatakeyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 123 days.

(21) Appl. No.: 12/050,802

(22) Filed: Mar. 18, 2008

(65) Prior Publication Data

US 2008/0171429 A1    Jul. 17, 2008

Related U.S. Application Data

(62) Division of application No. 11/455,645, filed on Jun. 20, 2006, now abandoned.

(30) Foreign Application Priority Data

Jun. 21, 2005    (JP) .............................. 2005-180731

(51) Int. Cl.
*H01L 21/8247* (2006.01)
(52) U.S. Cl. ................ 438/261; 257/316; 257/E21.422
(58) Field of Classification Search ................. 438/261; 257/316, E21.422
See application file for complete search history.

(56) References Cited

U.S. PATENT DOCUMENTS

| | | | |
|---|---|---|---|
| 5,923,976 A | 7/1999 | Kim | |
| 5,959,888 A | 9/1999 | Araki et al. | |
| 6,462,373 B2 | 10/2002 | Shimizu et al. | |
| 6,468,862 B1 * | 10/2002 | Tseng | ........................ 438/259 |
| 6,515,329 B2 * | 2/2003 | Lee et al. | ..................... 257/315 |
| 6,876,032 B2 * | 4/2005 | Hsieh | ......................... 257/315 |
| 7,038,268 B2 | 5/2006 | Kinoshita et al. | |
| 2001/0019150 A1 * | 9/2001 | Kawai et al. | ................. 257/315 |
| 2003/0006475 A1 * | 1/2003 | Tseng | ........................ 257/510 |
| 2004/0115882 A1 * | 6/2004 | Hung et al. | .................. 438/257 |
| 2005/0047261 A1 | 3/2005 | Kai et al. | |

(Continued)

FOREIGN PATENT DOCUMENTS

JP    2004-22819    1/2004

(Continued)

OTHER PUBLICATIONS

U.S. Appl. No. 11/774,891, filed Jul. 9, 2007, Watanabe.

*Primary Examiner*—Steven J Fulk
(74) *Attorney, Agent, or Firm*—Oblon, Spivak, McClelland, Maier & Neustadt, L.L.P.

(57) ABSTRACT

A semiconductor device includes a semiconductor layer having a plurality of element regions in its surface area, which are delimited by at least one element isolation trench, a plurality of floating gate electrodes provided on the element regions with a first gate insulation film interposed therebetween and each including a first charge-storage layer having a first width which is equal to that of each of the element regions and a second charge-storage layer stacked on the first charge-storage layer and having a second width which is smaller than the first width, and a plurality of control gate electrodes provided on the floating gate electrodes with a second gate insulation films interposed therebetween. The device further includes an element isolating insulation film buried into the element isolation trench. The top surface of the element isolating insulation film is located higher than that of the first charge-storage layer.

9 Claims, 2 Drawing Sheets

U.S. PATENT DOCUMENTS

| | | |
|---|---|---|
| 2005/0142765 A1* | 6/2005 | Joo .......................... 438/264 |
| 2006/0060913 A1 | 3/2006 | Ozawa |
| 2006/0278916 A1 | 12/2006 | Iino et al. |
| 2006/0281244 A1 | 12/2006 | Ichige et al. |

FOREIGN PATENT DOCUMENTS

| | | |
|---|---|---|
| JP | 2004-214510 | 7/2004 |
| JP | 2005-85996 | 3/2005 |

* cited by examiner

SEMICONDUCTOR DEVICE INCLUDING A FLOATING GATE ELECTRODE HAVING STACKED STRUCTURE

CROSS-REFERENCE TO RELATED APPLICATIONS

This application is a divisional of and claims the benefit of priority from U.S. application Ser. No. 11/455,645, filed Jun. 20, 2006 and is based upon and claims the benefit of priority from prior Japanese Patent Application No. 2005-180731, filed Jun. 21, 2005, the entire contents of which are incorporated herein by reference.

BACKGROUND OF THE INVENTION

1. Field of the Invention

The present invention relates to a semiconductor device. More specifically, the invention relates to a nonvolatile semiconductor memory device such as a flash memory, which includes memory cells formed of metal oxide semiconductor (MOS) transistors each having a double (stacked) gate structure.

2. Description of the Related Art

Flash electrically erasable and programmable read only memories (flash EEPROMs) have recently been well known as nonvolatile semiconductor memory devices that are capable of electrically rewriting (writing and erasing) data and suitable for high density and large capacity. The flash EEPROMs include memory cells of MOS transistors each having a double-gate structure in which a floating gate is provided between a silicon substrate and a control gate.

The nonvolatile semiconductor memory devices such as flash EEPROMs have the following problem. If the distance between adjacent memory cells in the word line direction is shortened, an interference effect occurs between the memory cells with increases in capacity coupling between adjacent floating gates. This problem deteriorates cell characteristics, such as write and erase characteristics of memory cells.

As a solution to the above problem, it can be thought that the distance between adjacent memory cells is lengthened by decreasing only the width of a floating gate in the word line direction without changing the design pitches of memory cells. However, a floating gate, which is opposed to a silicon substrate with a tunnel oxide film interposed therebetween, is decreased in sectional area if only it is decreased only in width. It is therefore feared that cell current will be reduced. With this solution, the problem with the deterioration of cell characteristics due to the interference effect between adjacent memory cells can be resolved, but a new problem that the reduction in cell current deteriorates the cell characteristics will occur.

The above new problem will become serious in a high-density, large-capacity NAND flash EEPROM such as a next-generation memory with 90 nm or less design rules and a multivalued memory for storing multivalued data.

As described above, the nonvolatile semiconductor memory devices are microfabricated more and more and likely to decrease in the distance between adjacent memory cells. They have required a technique capable of reducing an interference effect that occurs between adjacent memory cells with increases in capacity coupling between adjacent floating gates without decreasing cell current, and avoiding deteriorating cell characteristics due to the microfabrication.

In order to suppress the increase of capacity coupling between adjacent floating gates, there have been proposed methods of forming a recess in an element isolation insulating film provided between memory cells and then forming a control gate line (word line) in the recess. Of these methods, there is a method of reliably forming a control gate line in a recess of an element isolating insulation film even though an element isolation trench decreases in width to suppress the capacity coupling between floating gates (see, e.g., Jpn. Pat. Appln. KOKAI Publication 2005-85996). In the prior art devices, the floating gates are each formed of a single film having a uniform width, while the control gate line extends to a deep portion of the element isolating insulation film.

BRIEF SUMMARY OF THE INVENTION

According to a first aspect of the present invention, there is provided a semiconductor device comprising a semiconductor layer having a plurality of element regions in a surface area thereof, the element regions being delimited by at least one element isolation trench, a plurality of floating gate electrodes provided on the element regions with a first gate insulation film interposed therebetween, each of the floating gate electrodes including a first charge-storage layer having a first width which is equal to that of each of the element regions and a second charge-storage layer stacked on the first charge-storage layer and having a second width which is smaller than the first width, a plurality of control gate electrodes provided on the floating gate electrodes with a second gate insulation film interposed therebetween, and an element isolating insulation film buried into the element isolation trench, a top surface of the element isolation insulation film being located higher than that of the first charge-storage layer.

According to a second aspect of the present invention, there is provided a semiconductor device comprising a semiconductor layer having at least one element isolation trench in a surface area thereof, at least one element isolation region formed by burying an element isolating insulation film into the element isolation trench, a plurality of element regions electrically isolated by the element isolation region, a plurality of floating gate electrodes provided on the element regions with a first gate insulation film interposed therebetween, and a plurality of control gate electrodes provided on the floating gate electrodes with a second gate insulation film interposed therebetween, wherein the floating gate electrodes each have a stacked structure of two or more charge-storage layers, a width of a lowermost charge-storage layer being equal to that of each of the element regions, and a width of each of other upper charge-storage layers being smaller than that of the lowermost charge-storage layer, and a top surface of the lowermost charge-storage layer is located lower than that of the element isolating insulation film.

DETAILED DESCRIPTION OF THE INVENTION

An embodiment of the present invention will be+ described with reference to the accompanying drawings. It should be noted that the drawings are schematic ones and the dimension ratios shown therein are different from the actual ones.

Needless to say, the dimensions vary from drawing to drawing and so do the ratios of dimensions.

Figure 1A:
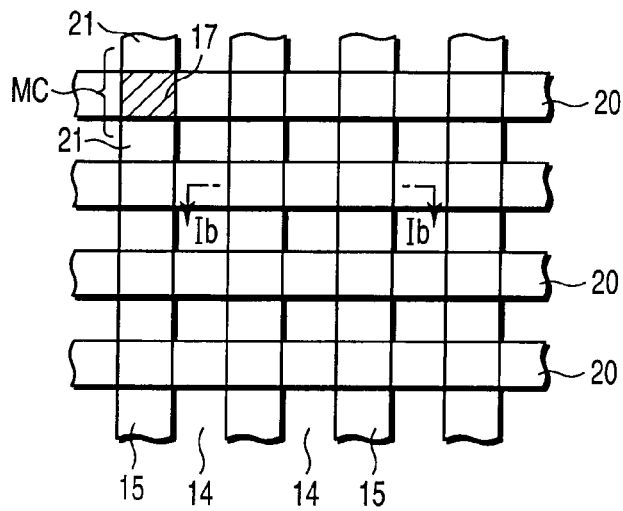
FIG. 1A is a plan view of a configuration of memory cells of a nonvolatile semiconductor memory device according to an embodiment of the present invention.
Figure 1B:
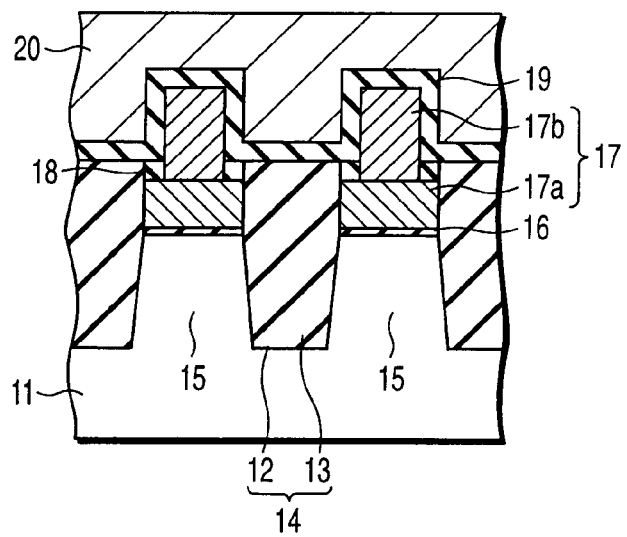
FIG. 1B is a sectional view of memory cells of the nonvolatile semiconductor memory device according to the embodiment of the present invention.
Figure 2:
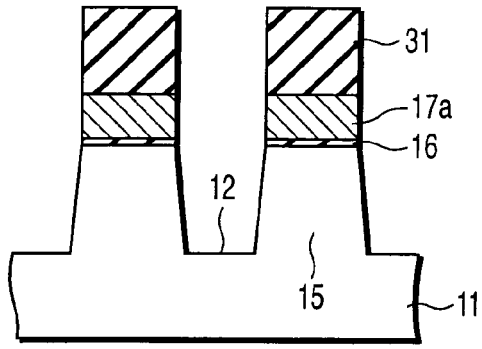
FIG. 2 is a sectional view illustrating a step of a method of manufacturing the nonvolatile semiconductor memory device according to the embodiment of the present invention.
Figure 3:
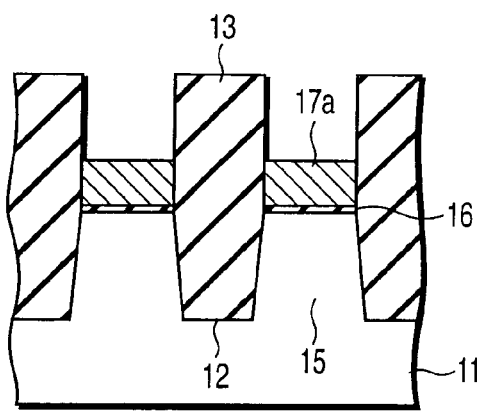
FIG. 3 is a sectional view illustrating a step of the method of manufacturing the nonvolatile semiconductor memory device according to the embodiment of the present invention.
Figure 4:
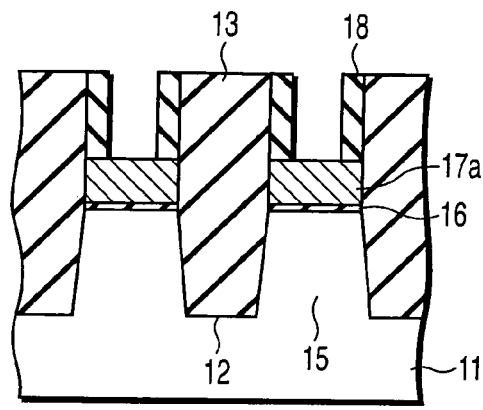
FIG. 4 is a sectional view illustrating a step of the method of manufacturing the nonvolatile semiconductor memory device according to the embodiment of the present invention.
Figure 5:
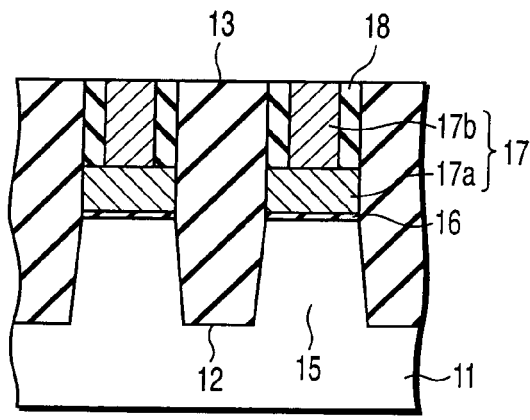
FIG. 5 is a sectional view illustrating a step of the method of manufacturing the nonvolatile semiconductor memory device according to the embodiment of the present invention.
Figure 6:
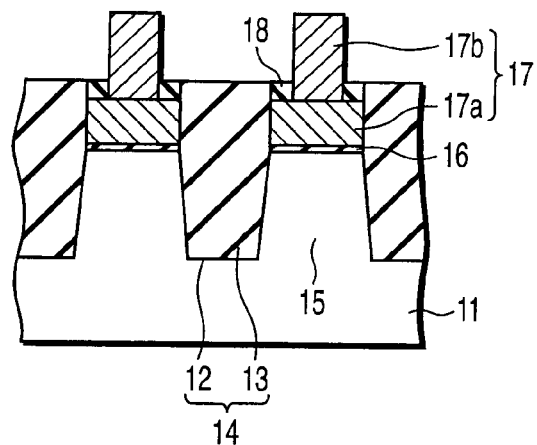
FIG. 6 is a sectional view illustrating a step of the method of manufacturing the nonvolatile semiconductor memory device according to the embodiment of the present invention.

FIGS. 1A and 1B show a basic configuration of a semiconductor device according to an embodiment of the present invention. The configuration will be described, taking as an example memory cells each having a double-gate structure in a nonvolatile semiconductor memory device such as a NAND flash EEPROM.

FIG. 1A is a plan view and FIG. 1B is a sectional view taken along line Ib-Ib.

A plurality of trenches 12 each serving as an element isolation trench are formed in the surface area of a p-type silicon substrate (or a p well region) 11 serving as a semiconductor layer. The trenches 12 are arranged in parallel in a first direction (bit line direction). An element isolating insulation film (e.g., a silicon oxide film that is referred to as a $SiO_2$ film hereinafter) 13 is buried into each of the trenches 12. Thus, an element isolation region 14 having a shallow trench isolation (STI) structure is formed to isolate element regions (described later) electrically from each other.

On the other hand, a plurality of element regions 15 are formed in the surface area of the p-type silicon substrate 11 and delimited by the trenches 12. A floating gate electrode (floating gate) 17 is formed on the top surface of each of element regions 15 serving as channel regions, with a tunnel oxide film (first gate insulation film) 16 interposed therebetween. The tunnel oxide film 16 is formed of a $SiO_2$ film having a thickness of, e.g., 150 Å or less.

In the present embodiment, the floating gate electrode 17 has a stacked structure in which two or more charge-storage layers are stacked one on another. The charge-storage layers include a first charge-storage layer (lowermost one) 17a and a second charge-storage layer (upper one) 17b. The width of the first charge-storage layer 17a in a second direction (word line direction) that is perpendicular to the first direction is almost equal to that of each of the element regions 15. In contrast, the width of the second charge-storage layer 17b in the second direction is smaller than that of the first charge-storage layer 17a.

The top surface of the element isolating insulation film 13 is located higher than that of the first charge-storage layer 17a (the interface surface between the first and second charge-storage layers 17a and 17b). On the first charge-storage layer 17a except the second charge-storage layer 17b, for example, a tetra ethoxy silane (TEOS) film 18 is provided such that its top surface is flush with that of the element isolating insulation film 13. Then, a control gate electrode 20 is formed on the top surfaces of the element isolating insulation film 13, TEOS film 18 and second charge-storage layer 17b, with a gate-to-gate insulation film (interpolysilicon insulation film) 19 serving as a second gate insulation film interposed therebetween. Each control gate electrode 20 is provided on a plurality of floating gate electrodes 17, which are arranged in the second direction, to serve as a word line.

The floating gate electrodes 17 and control gate electrodes 20 are self-aligned such that their end faces in the first direction coincide with the vertical direction, as shown in FIG. 1A. Further, an n-type diffusion layer 21 is formed in the surface area of each of the element regions 15 between control gate electrodes 20, with the result that a plurality of memory cells MC are arranged in matrix.

With the above configuration, between adjacent floating gate electrodes 17, the distance (first distance) between the first charge-storage layers 17a is left as conventional, and the distance (second distance) between the second charge-storage layers 17b, which corresponds to the gate-to-gate insulation film 19, can be lengthened apparently. Consequently, cell current can be maintained at the same value as a conventional one, which is determined by the design pitches of the element regions 15, and an interference effect that occurs between adjacent memory cells with increases in capacity coupling between adjacent floating gate electrodes 17 can greatly be reduced. The deterioration of cell characteristics due to microfabrication, such as the write and erase characteristics of memory cells MC, can easily be avoided.

If a NAND flash EEPROM is configured by the nonvolatile semiconductor memory device having memory cells described above, one end of a column of a given number of memory cells (e.g., sixteen memory cells) connected in series in the first direction is connected to a bit line via one select transistor, and the other end thereof is connected to a source line via the other select transistor.

A method of manufacturing a nonvolatile semiconductor memory device (having memory cells) so configured will be described with reference to FIGS. 2 to 6. This method employs a gate first-forming technique. FIGS. 2 to 6 are sectional views corresponding to FIG. 1B.

First, an insulation film serving as a tunnel oxide film 16 is formed on the surface of a p-type silicon substrate (or a p well region) 11 and then an impurity-doped polysilicon layer serving as a first charge-storage layer 17a is deposited on the insulation film by chemical vapor deposition (CVD). After that, a mask material 31 for processing the film 16 and layer 17a is formed on the polysilicon layer. As the mask material 31, a material such as a silicon nitride film (referred to as SiN film hereinafter), which allows an adequate selection ratio between the material and the polysilicon layer or a high-density plasma (HDP) film (described later), is employed. Using the mask material 31 as a mask, the polysilicon layer, insulation film and p-type silicon substrate 11 are self-aligned to form the first charge-storage layer 17a and the tunnel oxide film 16, and a trench 12 is opened to form element regions 15 (see FIG. 2).

The sidewall portions of the trench 12 and the first charge-storage layer 17a are oxidized when necessary. An HDP film serving as an element isolating insulation film 13 is deposited on the entire surface of the resultant structure to fill the trench 12 completely. Using the mask material 31 as a stopper, the top surface of the HDP film is flattened by CMP or the like. After that, the mask material 31 is removed by hot phosphoric acid (see FIG. 3).

A TEOS film 18 with good coverage is deposited on the top surface of the first charge-storage layer 17a from which the mask material 31 is removed. Part of the TEOS film 18 is etched back selectively until the top surface of the layer 17a is exposed, thereby leaving the TEOS film 18 only on the sidewall portions of the element isolating insulation film (HDP film) 13 (see FIG. 4).

An impurity-doped polysilicon layer serving as a second charge-storage layer 17b is grown on the exposed surface of the first charge-storage layer 17a by, e.g., selective epitaxial growth. After that, the top surface of the polysilicon layer is flattened by CMP or the like such that it becomes flush with the top surface of the HDP film. Thus, a floating gate electrode 17 having a stacked structure of two polysilicon layers (first and second charge-storage layers 17a and 17b) is formed. The sidewalls of the second polysilicon layer are formed more inwardly than those of the first polysilicon layer (see FIG. 5).

The TEOS film 18 and the HDP film are etched using an etching material that allows an adequate selection ratio between the material and the polysilicon layers and also allows the TEOS and HDP films to be etched to the same extent. The TEOS film 18 and HDP film are etched together such that the top surface of the HDP film is located higher than that of the first charge-storage layers 17a (See FIG. 6).

A gate-to-gate insulation film (e.g., ONO film) 19 is deposited on the entire surface of the resultant structure and then control gate electrodes 20 are self-aligned. An n-type diffusion layer 21 is formed in the surface area of each of element regions 15 between the control gate electrodes 20. Accordingly, a nonvolatile semiconductor memory device having memory cells as shown in FIG. 1 is completed.

As described above, the width of the second charge-storage layer 17b of the floating gate electrode 17 in the second direction is set narrower than the first charge-storage layer 17a thereof in the second direction. The top surface of the element isolating insulation film 13 is located higher than that of the first charge-storage layer 17a. Thus, the width of the first charge-storage layer 17a is left as conventional design pitches, and the apparent distance between adjacent memory cells MC arranged in the second direction along the control gate electrodes 20, which corresponds to the gate-to-gate insulation film 19 on the element isolating insulation film 13, can be lengthened. Consequently, even though the distance between the floating gate electrodes 17 is shortened due to microfabrication, an interference effect that occurs between adjacent memory cells with increases in capacity coupling between the floating gate electrodes 17 can be reduced without decreasing cell current, and the deterioration of cell characteristics due to the microfabrication can easily be avoided.

In the foregoing embodiment, the polysilicon layer serving as the second charge-storage layer 17b is formed by selective epitaxial growth. The present invention is not limited to this. It can be formed by CVD or the like.

The present invention is not limited to a nonvolatile semiconductor memory device to be manufactured by the gate first-forming technique. It can be applied to a nonvolatile semiconductor memory device to be manufactured by a gate last-forming technique.

The stacked structure of the floating gate electrode 17 is not limited to two layers of the first and second charge-storage layers 17a and 17b. For example, it can be two or more charge-storage layers stacked one on another. In this case, the width of the lowermost charge-storage layer in the second direction is almost equal to that of the element region, and the width of each of upper charge-storage layers in the second direction is smaller than that of the lowermost charge-storage layer in the second direction, or the charge-storage layers can be gradually decreased in width.

The semiconductor layer is not limited to the p-type silicon substrate (or p well region). It can be applied to an n-type silicon substrate (or n well region).

The present invention is not limited to the NAND type flash EEPROM. It can be applied to various types of nonvolatile semiconductor memory device configured by memory cells of MOS transistors each having a double-gate structure, such as NOR and AND memory devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of fabricating a semiconductor device, comprising:
   forming a first insulating film on a semiconductor substrate; forming a first charge storage layer on the first insulating film;
   forming a mask material on the first charge storage layer;
   etching the first charge storage layer, the first insulating film and the semiconductor substrate using the mask material as a mask so as to form a trench;
   forming a second insulating film in the trench so that a first upper surface of second insulating film is flush with a second upper surface of the mask material;
   removing the mask material so as to expose a third upper surface of the first charge storage layer;
   forming a third insulating film on the third upper surface of the first charge storage layer and on an inner side surface of the second insulating film so as to expose a center of the third upper surface of the first charge storage layer;
   forming a second charge storage layer on the exposed center of the third upper surface of the first charge storage layer, a fourth upper surface of the second charge storage layer being flush with the first upper surface of the second insulating film, a width of the second charge storage layer being smaller than a width of the first charge storage layer;
   etching the second and the third insulating films so that a side surface of the second charge storage layer is exposed, a fifth upper surface of the etched second and third insulating films is located between a level of the third upper surface of the first charge storage layer and a level of a fourth upper surface of the second charge storage layer;
   forming a fourth insulating film on the second charge storage layer; and
   forming a control gate electrode on the fourth insulating film.

2. The method according to claim 1, wherein the first charge storage layer is formed by a chemical vapor deposition (CVD) method.

3. The method according to claim 1, wherein the first charge storage layer includes an impurity-doped polysilicon film.

4. The method according to claim 1, wherein the mask material includes a silicon nitride film.

5. The method according to claim 1, wherein the second insulating film includes a high density plasma (HDP) film.

6. The method according to claim 1, wherein the third insulating film includes a TEOS film.

7. The method according to claim 1, wherein the fourth insulating film includes an ONO film.

8. The method according to claim 1, wherein the second charge storage layer formed by a selective epitaxial growth method.

9. The method according to claim 1, wherein the second charge storage layer formed by a chemical vapor deposition (CVD) method.

* * * * *